US006822161B2

United States Patent
Komatsu et al.

(10) Patent No.: US 6,822,161 B2
(45) Date of Patent: Nov. 23, 2004

(54) HOUSING HAVING ELECTROMAGNETIC WAVE SHIELDING AND WATERPROOF STRUCTURE

(75) Inventors: Kazuo Komatsu, Tokyo (JP); Hidekazu Kusama, Tokyo (JP)

(73) Assignees: NEC Corporation, Tokyo (JP); Mitsuya Co., Ltd., Tokyo (JP)

( * ) Notice: Subject to any disclaimer, the term of this patent is extended or adjusted under 35 U.S.C. 154(b) by 0 days.

(21) Appl. No.: 10/700,631

(22) Filed: Nov. 5, 2003

(65) Prior Publication Data

US 2004/0188120 A1 Sep. 30, 2004

(30) Foreign Application Priority Data

Nov. 6, 2002 (JP) ...................................... 2002/322982

(51) Int. Cl.[7] .............................................. H05K 9/00
(52) U.S. Cl. .............................. 174/35 GC; 174/35 R; 361/816; 277/920
(58) Field of Search ...................... 174/35 GC; 361/818, 361/800, 816; 277/920

(56) References Cited

U.S. PATENT DOCUMENTS

| | | | | |
|---|---|---|---|---|
| 4,720,606 A | * | 1/1988 | Senn ...................... | 174/35 GC |
| 5,107,071 A | * | 4/1992 | Nakagawa .............. | 174/35 GC |
| 5,565,656 A | * | 10/1996 | Mottahed ................ | 174/35 GC |
| 5,731,541 A | * | 3/1998 | Bernd et al. ............ | 174/35 GC |
| 5,882,729 A | * | 3/1999 | Kahl et al. ................... | 427/265 |
| 6,323,418 B1 | * | 11/2001 | Tiburtius et al. .......... | 174/35 R |
| 2003/0209355 A1 | * | 11/2003 | Jensen et al. ........... | 174/35 GC |

FOREIGN PATENT DOCUMENTS

JP      2001-160697 A      6/2001

* cited by examiner

*Primary Examiner*—Hung V. Ngo
(74) *Attorney, Agent, or Firm*—Sughrue Mion, PLLC

(57) ABSTRACT

In a housing having a sealing structure providing an electromagnetic wave shielding function and a waterproof function between first and second housing components (1, 2) which define a space therebetween, the sealing structure includes a groove portion (12) made in the first housing component to extend around the space, a first seal member (13) formed by being directly applied into the groove portion, a second seal member (14) formed by being applied onto the first seal member, and a pressing portion (16) formed on the second housing component to correspond to the groove portion. The first seal member has relatively low hardness to be compressible. The second seal member has relatively high hardness, flexibility, and conductivity. When the first and second housing component are combined to each other, the pressing portion pressingly deforms the second seal member so as to be brought into surface contact with the second seal member. The first and second housing component are made of magnetic metal.

12 Claims, 3 Drawing Sheets

HOUSING HAVING ELECTROMAGNETIC WAVE SHIELDING AND WATERPROOF STRUCTURE

This application claims priority to prior application JP 2002-322982, the disclosure of which is incorporated herein by reference.

BACKGROUND OF THE INVENTION

The present invention relates to a housing having an electromagnetic wave shielding function and a waterproof function.

A measure to counter electromagnetic waves is required for communications devices or electronic devices and, particularly when disposed outdoors, a waterproof measure is also required for them. Accordingly, housings for those devices are expected to have an electromagnetic wave shielding function and a waterproof function.

The housing of this type is disclosed in, for example, JP-A-2001-160697, and comprises a box having an opening on one side thereof, and a cover closing the opening. The box is made of magnetic metal and has an edge portion defining the opening. The cover is made of magnetic metal and has a groove confronting the edge portion of the box.

For sealing between the box and the cover, a gasket is placed in a groove formed on the edge portion of the box. The gasket has a structure wherein conductive electromagnetic wave shielding rubber is disposed on the surface of highly elastic rubber excellent in restoration against compression.

After placing the gasket in the groove on the edge portion of the box, an electronic circuit component is received in the box. Then, the cover is put on the box, and the box and the cover are fixed together by fixing means whit pressing the cover against the gasket. As a result, electromagnetic wave shielding and waterproofness are ensured between the box and the cover.

However, inasmuch as the foregoing housing is configured such that the cover is pressed against the separately formed gasket received in the groove on the edge portion of the box, gaps are liable to occur between the box and the cover. Specifically, since the electromagnetic wave shielding rubber forming the surface of the gasket is relatively poor in restoration against compression, a contact between the cover and the gasket tends to be a line contact, and besides, dispersion of components constituting the housing, which is caused upon manufacturing them, can not be absorbed, and therefore, possibility is high that the foregoing gaps are generated. When the gaps are generated, there arise problems of invasion of electromagnetic waves into the housing, leakage of electromagnetic waves to the exterior of the housing, and invasion of water into the housing. Accordingly, sufficient electromagnetic wave shielding and waterproof functions can not be achieved.

SUMMARY OF THE INVENTION

It is therefore an object of the present invention to provide a housing that has sufficient electromagnetic wave shielding and waterproof functions even if there is dispersion in material or processing accuracy.

Other objects of the present invention will become dear as the description proceeds.

According to an aspect of the present invention, there is provided a housing comprising a first housing component made of magnetic metal and having a first surface, a second housing component made of magnetic metal and having a second surface confronting the first surface, the second housing component being cooperated with the first housing component to define a space, and a sealing structure providing an electromagnetic wave shielding function and a waterproof function between the first and second housing components. The sealing structure comprises a groove portion formed on the first surface and extending around the space, a first seal member formed by being directly applied into the groove portion, the first seal member having relatively low hardness to be compressible, a second seal member formed by being applied onto the first seal member, the second seal member having relatively high hardness, flexibility, and conductivity, and a pressing portion formed on the second surface to correspond to the groove portion, the pressing portion pressingly deform the second seal member so as to be brought into surface contact with the second seal member.

DESCRIPTION OF THE PREFERRED EMBODIMENT

Figure 1:
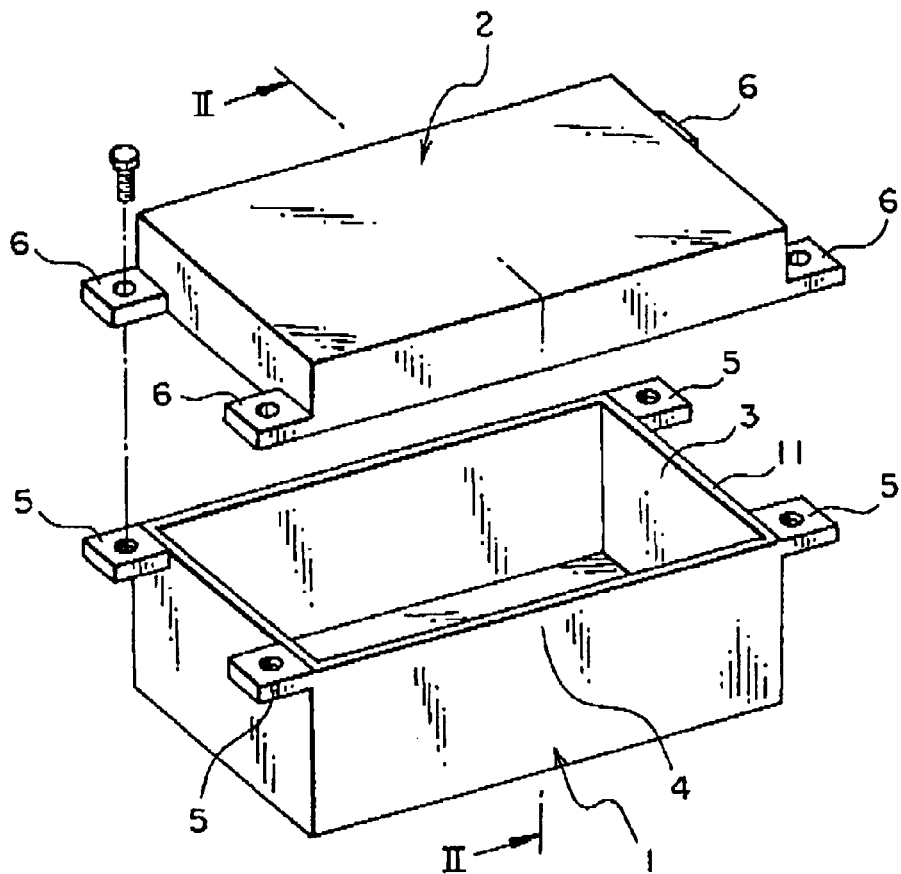
FIG. 1 is a perspective view showing a housing, in a disassembled state, according to a first embodiment of the present invention.
Figure 2:
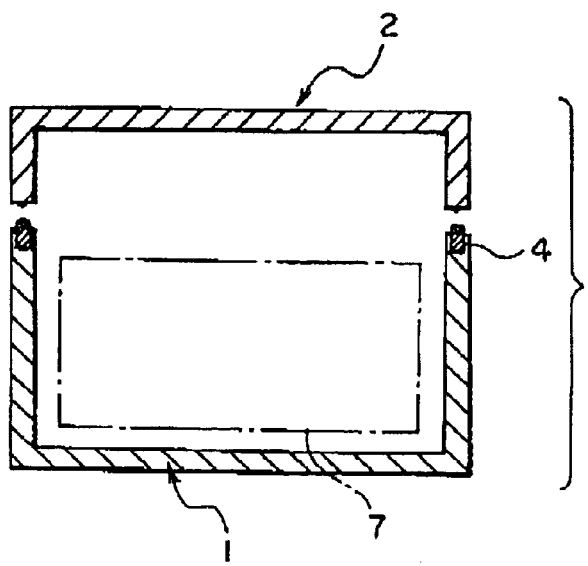
FIG. 2 is a sectional view taken along line II—II In FIG. 1.

Referring to FIGS. 1 and 2, description will be given about an overall structure of a housing according to a first embodiment of the present invention.

The shown housing is used for a communications device or an electronic device, and comprises a rectangular parallelepiped box 1 made of magnetic metal and serving as a first housing component, and a cover 2 made of magnetic metal and serving as a second housing component. The box 1 has an opening 3 on an upper side thereof. The cover 2 is for closing the opening 3 of the box 1. When the opening 3 of the box 1 is closed by the cover 2, the housing having a space inside is formed.

At four corners of an edge portion 4 defining therein the opening 3 of the box 1, projection pieces 5 each projecting outward are formed. Similarly, the cover 2 is also formed with projection pieces 6 that confront the projection pieces 5 of the box 1, respectively. In the state where an electronic circuit component 7 of the communications device or electronic device is received in the box 1 and the opening 3 is closed by the cover 2, four screws 8 (only one is shown for the sake of brevity) as fixing members are tightened to clamp the projection pieces 5 of the box 1 and the projection pieces 6 of the cover 2 in mutually approaching directions so as to fixedly join them together. A sealing structure is provided between the box 1 and the cover 2 for accomplishing an electromagnetic wave shielding function and a waterproof function.

Figure 3:
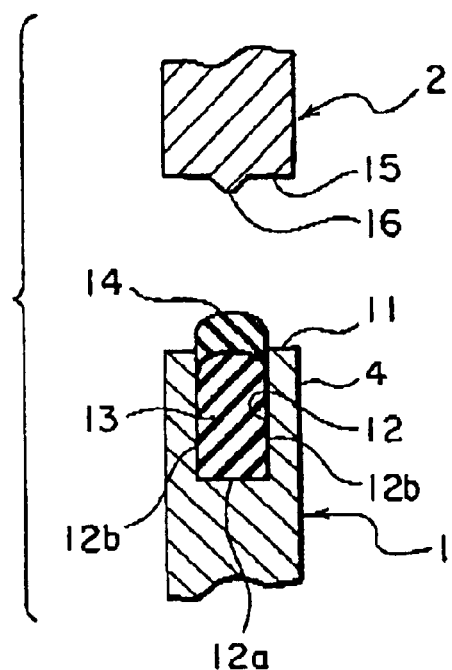
FIG. 3 is an enlarged sectional view showing only the main part of FIG. 2.
Figure 4:
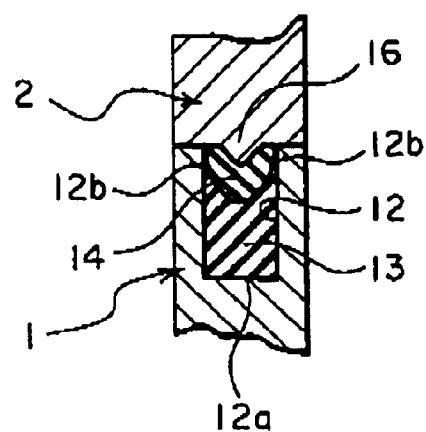
FIG. 4 is a sectional view similar to FIG. 3, wherein the housing is in an assembled state.

Referring also to FIGS. 3 and 4, the sealing structure will be described.

On a surface (first surface) 11 of the box 1 that confronts the cover 2, a groove portion 12 is formed so as to extend in a four-cornered annular shape along the edge portion 4. The groove portion 12 is provided therein with a first seal member 13 made of soft silicon being a compressible soft material having a low hardness. The first seal member 13 is formed at a height equal to a level of the first surface 11 or not projecting from the level of the first surface 11. The first seal member 13 is formed by being directly applied or coated into the groove portion 12 and then dried. Because of being directly applied into the groove portion 12, the first seal member 13 tightly adheres to a bottom surface 12a and both side surfaces 12b of the groove portion 12, which is preferable.

Further, a second seal member 14 is provided on the first seal member 13 to close an opening of the groove portion 12. The second seal member 14 has relatively high hardness, flexibility, and conductivity. More particularly, the second seal member 14 is made of hard silicon containing a metal filler as a hard material, and formed by being directly applied or coated onto the surface of the first seal member 13 so as to project from the first surface 11 and then dried. Because of being directly applied to the first seal member 13, the second seal member 14 tightly adheres to the surface of the first seal member 13.

On a surface (second surface) 15 of the cover 2 that confronts the box 1, a pressing portion 16 is formed correspondingly to the groove portion 12 so as to extend in a four-cornered annular shape. The pressing portion 16 is in the form of a projection protecting from the second surface 15. Preferably, the first and second surfaces 11 and 15 are formed so as to extend along the plane, respectively, thereby to be matched with each other.

Figure 5:
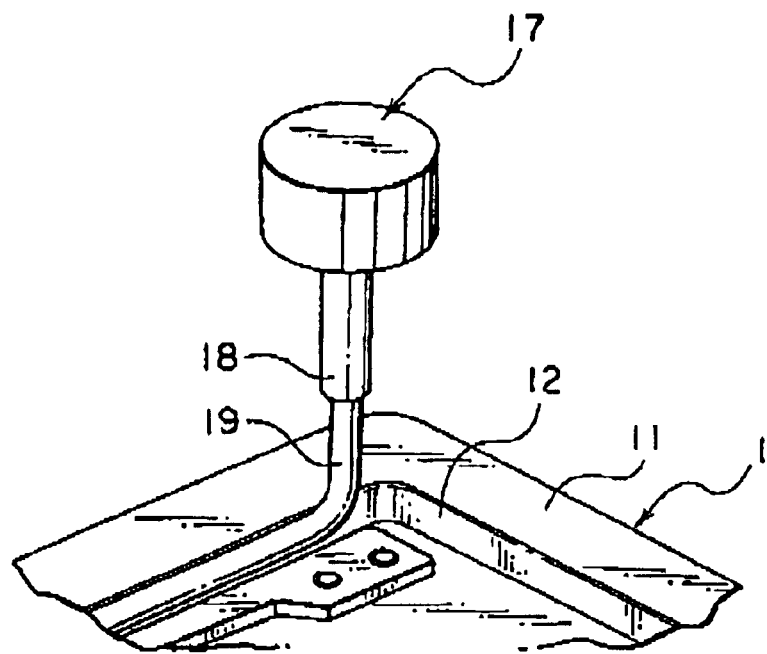
FIG. 5 is a view for describing a method of directly forming a seal member to the housing.

Referring to FIG. 5, the description will be made as regards a method of directly forming the first and second seal members 13 and 14.

In order to form the first and second seal members 13 and 14, use is made of an automatically applying unit 17 having an outlet nozzle 18 for discharging a paste-like silicon 19. The outlet nozzle 18 is positioned to face the groove portion 12.

On forming the first seal member 13, the automatically applying unit 17 redundantly discharges the paste-like silicon 19 through the outlet nozzle 18 towards the groove portion 12 with being moved along the groove portion 12. This results in placing or painting the paste-like silicon 19 into the groove portion 12 as illustrated in FIG. 5. After being placed or applied in the groove portion 12, the paste-like silicon 19 is dried to produce the first seal member 13. In this event, it is a matter of course that a paste of the soft silicon is used as the paste-like silicon 19.

On forming the second seal member 14, the automatically applying unit 17 redundantly discharges the paste-like silicon 19 through the outlet nozzle 18 on the first seal member 13 with being moved along the groove portion 12. This results in placing or painting the paste-like silicon 19 on the first seal member 13. After being placed or applied on the first seal member 13, the paste-like silicon 19 is dried to produce the second seal member 14. In this event, it is a matter of course that a paste of the hard silicon is used as the paste-like silicon 19.

Now, an operation of the foregoing housing will be described.

The electronic circuit component 7 of the communications device or electronic device is put in the box 1, then the cover 2 is placed on the box 1. In this event, the pressing portion 16 rides on the surface of the second seal member 14. In this state, the cover 2 is clamped to the box 1 using the screws 8. Following tightening of the screws 8, the pressing portion 16 pushes the second seal member 14 toward the inside of the groove portion 12. Then, as shown in FIG. 4, the first seal member 13 is depressed by the pressing portion 15. Finally, the second seal member 14 is elastically deformed into a state where the second seal member 14 does not project from the first surface 11 while compressing the first seal member 13, i.e. a state where the second seal member 14 is plunged into the groove portion 12. As a result, the second seal member 14 is brought into surface contact with the pressing portion 16 so as to wrap it. Further, the second seal member 14 is pressed against the pressing portion 16 by a restoring force of the first seal member 13. Therefore, the surface of the second seal member 14 is matched with the surface of the pressing portion 16 so as to tightly adhere thereto.

When the cover 2 is securely clamped to the box 1 using the screws 8, the second seal member 14 is pressed against the pressing portion 16 in surface contact. It may be assumed that slight gaps remain between the first and second seal members 13 and 14 and the side surfaces 12b of the groove portion 12 due to distortion of the box 1 and/or the cover 2, or due to failure in application of silicon or the like. However, since a portion of the first seal member 13 corresponding to a depressed volume is forced upward while touching the side surfaces 12b of the groove portion 12, those gaps are reduced or disappear. Therefore, an excellent waterproof function is ensured between the box 1 and the cover 2.

In addition, since the second seal member 14 is pressed against the pressing portion 16 of the cover 2 and particularly the side surfaces 12b of the groove portion 12 of the box 1, the box 1 and the cover 2 are securely connected to each other also electrically via the conductive second seal member 14. That is, there is formed an electrical path extending from the box 1 and reaching the cover 2 via the second seal member 14. Therefore, an excellent electromagnetic wave shielding function is ensured between the box 1 and the cover 2.

Figure 6:
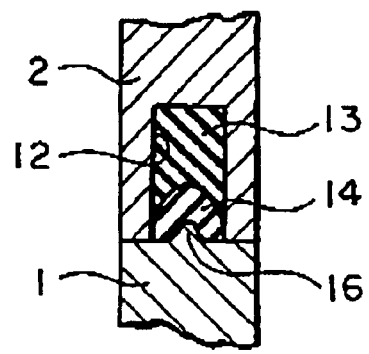
FIG. 6 is an enlarged sectional view showing only the main part of a housing according to a second embodiment of the present invention.

Referring to FIG. 6, the description will be directed to a housing according to a first embodiment of the present invention. Similar parts or portions are designated by like reference numerals.

In the housing of FIG. 5, the cover 2 is provided with the first and second seal members 13 and 14 while the box 1 is provided with the pressing portion 16 that may be in the form of a projection projecting from the first surface 11. In this event, the cover 2 serves as the first housing component, the box 1 serving as the second component.

While the present invention has thus far been described in connection with a few embodiments thereof, ft will readily be possible for those skilled in the art to put this invention into practice in various other manners. For example, the first seal member may be made of a high-molecular material such as resin having moisture resistance. Moreover, although the housings are suitable for communications devices such as radio base stations or the like for portable telephones, it is readily understood that they are also usable for various other electronic devices.

What is claimed is:

1. A housing comprising:
   a first housing component made of magnetic metal and having a first surface;
   a second housing component made of magnetic metal and having a second surface confronting said first surface, said second housing component being cooperated with said first housing component to define a space; and a sealing structure providing an electromagnetic wave shielding function and a waterproof function between said first and second housing components, said sealing structure comprising:

a groove portion formed on said first surface and extending around said space;

a first seal member formed by being directly applied into said groove portion, said first seal member having relatively low hardness to be compressible;

a second seal member formed by being applied onto said first seal member, said second seal member having relatively high hardness, flexibility, and conductivity; and a pressing portion formed on said second surface to correspond to said groove portion, said pressing portion pressingly deform said second seal member so as to be brought into surface contact with said second seal member.

2. The housing according to claim 1, further comprising a joining member clamping said first and second housing components in mutually approaching directions to join them together.

3. The housing according to claim 2, wherein said joining member comprises a screw engaging with said first and second housing components.

4. The housing according to claim 1, wherein said first seal member is formed so as not to project from said first surface, while said second seal member is formed so as to project from said first surface.

5. The housing according to claim 1, wherein said first seal member comprises soft silicon.

6. The housing according to claim 1, wherein said first seal member comprises a high-molecular soft material having moisture resistance.

7. The housing according to claim 1, wherein said second seal member comprises hard silicon and a metal filler added to said hard silicon.

8. The housing according to claim 1, wherein said pressing portion comprises a projecting portion projecting from said second surface and inserted into said groove portion so as to be brought into contact with said second seal member.

9. The housing according to claim 8, wherein said second seal member is pressed against said projecting portion by a restoring force of said first seal member.

10. The housing according to claim 1, wherein said first housing component is a box having an opening on one side thereof and substantially forming said space, said second housing component being a cover which closes said opening.

11. The housing according to claim 1, wherein said second housing component is a box having an opening on one side thereof and substantially forming said space, said first housing component being a cover which closes said opening.

12. The housing according to claim 1, wherein said second seal member has a surface which is matched with a surface of said pressing portion when pressingly deformed by said pressing portion.

* * * * *